United States Patent [19]
Tochihara et al.

[11] Patent Number: 5,787,342
[45] Date of Patent: Jul. 28, 1998

[54] RECEIVER

[75] Inventors: Shunji Tochihara, Nishitama-gun; Yoshinari Nanao, Hamura, both of Japan

[73] Assignee: Kokusai Electric Co., Ltd., Tokyo, Japan

[21] Appl. No.: 684,139

[22] Filed: Jul. 18, 1996

[30] Foreign Application Priority Data

Jul. 21, 1995 [JP] Japan ................. 7-207545

[51] Int. Cl.$^6$ ............................. H04B 1/06
[52] U.S. Cl. ............... 455/264; 455/186.1; 455/262; 455/254
[58] Field of Search ................. 455/264, 258, 455/257, 255, 186.1, 254, 262, 180.4

[56] References Cited

U.S. PATENT DOCUMENTS

| | | | |
|---|---|---|---|
| 4,726,051 | 2/1988 | Schuermann | 455/54.1 X |
| 4,761,825 | 8/1988 | Ma | 455/186.1 X |
| 4,903,329 | 2/1990 | Marik et al. | 455/264 X |
| 4,921,467 | 5/1990 | Lax | 455/264 |
| 5,410,733 | 4/1995 | Niva | 455/33.2 |
| 5,479,452 | 12/1995 | Hayes et al. | 455/257 X |
| 5,557,244 | 9/1996 | Salvi | 455/260 X |

*Primary Examiner*—Thomas Mullen
*Attorney, Agent, or Firm*—Wenderoth, Lind & Ponack

[57] ABSTRACT

In a receiver of the present invention, a local oscillator frequency, used as a basis for a reception unit to demodulate a received signal, is generated by a local oscillator based on a reference frequency, which is generated by a voltage-controlled oscillator whose oscillation frequency is adjusted by a control voltage applied thereto. The control voltage is prescribed by a decoding unit which monitors a reception electric field intensity (RSSi) or an error rate in the reception unit. The control voltage is adjusted in a manner to increase the reception electric field intensity (RSSi) or reduce the error rate. When the local oscillator frequency experiences a large deviation and the signal cannot be received with good reception sensitivity, the decoding unit generates a control voltage in a manner so as to eliminate the deviation and applies the generated control voltage to the voltage-controlled oscillator for automatically adjusting the local oscillator frequency to a level having a reduced deviation.

20 Claims, 1 Drawing Sheet

Prior Art

RECEIVER

BACKGROUND OF THE INVENTION

1. Field of the Invention:

The present invention relates to a receiver for decoding received data based on a local oscillator frequency, and more particularly to a receiver having a means for automatically adjusting a local oscillator frequency.

2. Description of the Prior Art:

Receivers such as those used in portable telephone sets, pagers, or the like are required to adjust a local oscillator frequency for a decoding process in order to receive data with good reception sensitivity. Specifically, such a receiver is required to adjust its own local oscillator frequency so as to maximize a reception electric field intensity (RSSi) or minimize the bit error rate of a received signal.

Prior to this invention, it has been customary for the manufacturer of a receiver to adjust the local oscillator frequency in the receiver by manually adjusting a trimmer capacitor, a laser trimming capacitor, or the like in the receiver when the receiver is manufactured. For example, as shown in FIG. 1 of the accompanying drawings, when a receiver 1 is manufactured on a production line, the operator connects a monitor frequency counter 5 to a crystal oscillator 2 in the receiver 1, and adjusts a trimmer capacitor 3 with a tool 6 such as a screwdriver or the like to adjust a local oscillator frequency to be supplied to a decoder 4 in the receiver 1 while viewing the local oscillator frequency generated by the crystal oscillator 2 on the frequency counter 5.

However, the conventional practice of adjusting the local oscillator frequency in the receiver on the production line has required a manual adjusting process which is tedious, time-consuming, and inefficient to carry out, resulting in poor productivity and high costs. Another problem is that the trimmer capacitor experiences early capacitor variations due to environmental changes, aging, shocks, etc., and hence, it needs to be readjusted or is likely to cause a receiver failure.

Furthermore, since a receiver is fixedly adjusted to a certain local oscillator frequency, the local oscillator frequency is unable to cope with changes in reception in actual fields of use after initial adjustment, and the receiver fails to provide reception sensitivity which is of a high level at all times.

SUMMARY OF THE INVENTION

It is an object of the present invention to provide a receiver which is capable of automatically adjusting a local oscillator frequency without prior manual intervention.

Still another object of the present invention is to provide a receiver which can provide a high level of reception sensitivity at all times regardless of changes in reception in actual fields of use.

To achieve the above objects of the present invention, there is provided a receiver comprising a reception unit for demodulating a received signal, a decoding unit for decoding the received signal which has been demodulated by said reception unit, a local oscillator for supplying a local oscillator frequency to said reception unit as a basis for demodulating the received signal, and a voltage-controlled oscillator for generating a reference frequency as a basis for the local oscillator frequency. The decoding unit comprises means for monitoring a reception electric field intensity in the reception unit and for prescribing a control voltage applied to the voltage-controlled oscillator in a manner to increase said reception electric field intensity.

With the above arrangement, the local oscillator frequency used as a basis for a reception unit to demodulate the received signal is generated by the local oscillator based on the reference frequency, which is generated by the voltage-controlled oscillator whose oscillation frequency is controlled by the control voltage applied thereto. The control voltage is controlled by the decoding unit which monitors the reception electric field intensity in the reception unit. The control voltage applied to the voltage-controlled oscillator is controlled in a manner so as to increase the reception electric field intensity.

When the local oscillator frequency experiences a large deviation and the signal cannot be received with high reception electric field intensity, the decoding unit generates a control voltage in a manner so as to eliminate the deviation and applies the generated control voltage to the voltage-controlled oscillator for automatically adjusting the local oscillator frequency to the level having a reduced deviation. Therefore, the receiver can provide a high level of reception sensitivity at all times in actual fields of use.

According to another aspect of the present invention, there is also provided a receiver comprising a reception unit for demodulating a received signal, a decoding unit for decoding the received signal which has been demodulated by the reception unit, a local oscillator for supplying a local oscillator frequency to the reception unit as a basis for demodulating the received signal, and a voltage-controlled oscillator for generating a reference frequency as a basis for the local oscillator frequency. The decoding unit comprises means for monitoring an error rate of the received signal which has been demodulated by the reception unit and for prescribing a control voltage applied to the voltage-controlled oscillator in a manner to reduce the error rate.

According to the other aspect of the present invention, with the above arrangement the control voltage applied to the voltage-controlled oscillator, which generates the reference frequency, is adjusted by the decoding unit which monitors the error rate of the demodulated received signal in a manner to reduce the error rate.

When the local oscillator frequency experiences a large deviation and the error rate of the received signal is large, the decoding unit generates a control voltage in a manner so as to eliminate the deviation and applies the generated control voltage to the voltage-controlled oscillator for automatically adjusting the local oscillator frequency to the level having a reduced deviation. Therefore, the receiver can provide a high level of reception sensitivity at all times in actual fields of use.

The receiver further comprises a memory for storing a setting of the control voltage which has been obtained according to the reception of an adjustment signal by the receiver when the receiver is manufactured. The decoding unit comprises means for controlling the control voltage based on the setting read from the memory.

The memory stores the setting of the control voltage obtained based on the adjustment signal reception by the receiver in the manufacturing process, and, when required, the decoding unit reads the setting from the memory and uses the setting for the control of the voltage-controlled oscillator. Therefore it is possible to automatically and quickly adjust the local oscillator frequency in a simple and efficient process of having the receiver receive the adjustment signal, rather than a manual adjustment process with large-scale equipment which have previously been conducted on the production line.

The setting stored in the memory is used when the reception electric field intensity or the error rate is very poor due to noise caused by fading, interference, or the like, and allows the receiver to receive signals in a high level of reception electric field intensity or with a low error rate, using the local oscillator frequency adjusted based on the setting of control voltage. When the quality of the received signal is relatively low in geographical areas where the electric field intensity is low, if the local oscillator frequency was adjusted based on the received data of low quality, the local oscillator frequency might be incorrectly adjusted. According to the present invention, the decoding unit determines a reduction in the quality of the received signal and controls the voltage-controlled oscillator with the setting stored in the memory for adjusting the local oscillator frequency at a certain level of accuracy.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

The principles of the present invention are particularly useful when embodied in a receiver which may be used as a receive-only receiver for a pager or the like or a receiver unit in a transmitter/receiver for a portable telephone set or the like.

Figure 1:
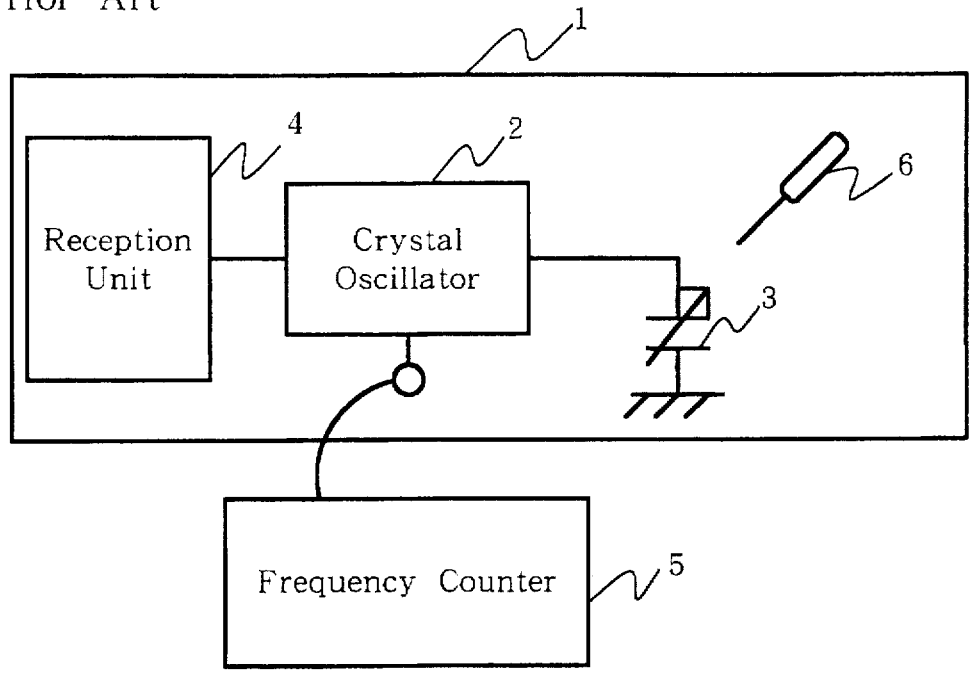
FIG. 1 is a block diagram illustrative of a conventional process of adjusting the local oscillator frequency in a receiver.
Figure 2:
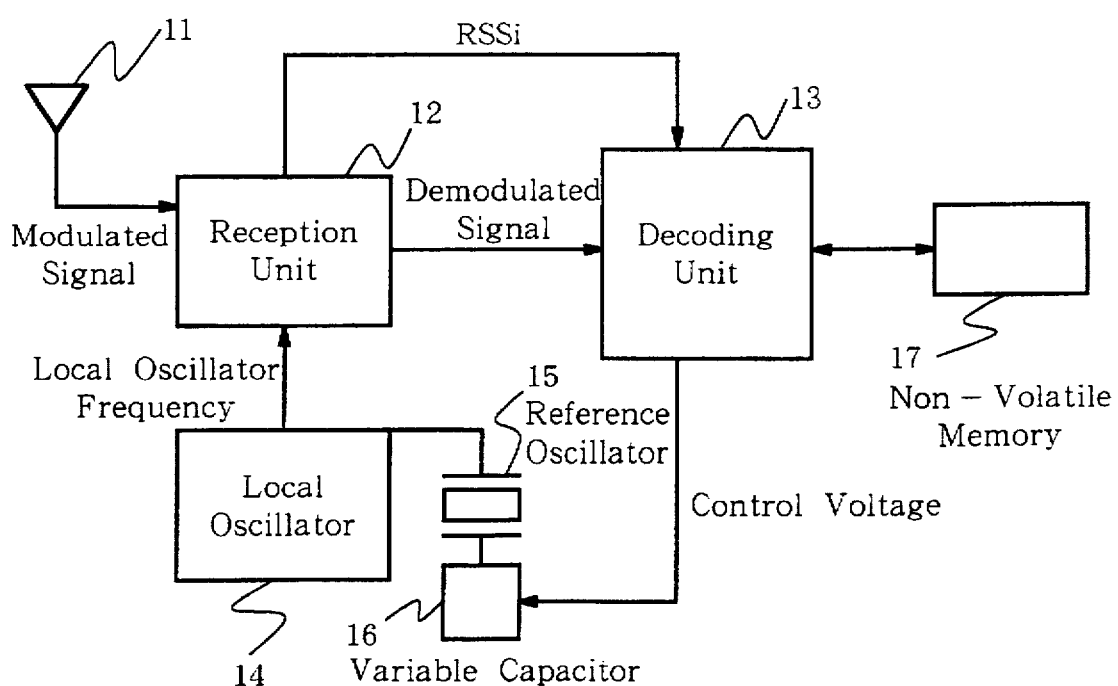
FIG. 2 is a block diagram of a receiver according to an embodiment of the present invention.

As shown in FIG. 2, a receiver according to an embodiment of the present invention comprises a reception unit 12 for demodulating received data supplied from an antenna 11, a decoding unit 13 for decoding demodulated data from the reception unit 12, a local oscillator 14 for generating and supplying a local oscillator frequency to the decoding unit 13 as a basis for the decoding process in the decoding unit 13, a reference oscillator 15 for generating and supplying a reference frequency to the local oscillator 14 as a basis for the local oscillator frequency, a variable capacitor 16 connected to the reference oscillator 15, and a non-volatile memory 17 for holding settings (control voltages) established on the production line during manufacturing of the receiver.

The reference oscillator 15 with the variable capacitor 16 connected thereto serves as a voltage-controlled oscillator (VCO). When a control voltage supplied from the decoding unit 13 is applied to the variable capacitor 16 to vary the capacitance thereof, the reference oscillator 15 varies the reference frequency generated.

The non-volatile memory 17 comprises a read/write memory, such as an electrically erasable programmable ROM (EEPROM) or the like, which can retain stored information without power.

The decoding unit 13 has a function of detecting the error rate of the received signal that has been demodulated, and controlling the control voltage which it generates to a level so as to reduce the detected error rate. The decoding unit 13 also has a function of determining the magnitude of the reception electric field intensity (RSSi) which is inputted from the reception unit 12, and controlling the control voltage which it generates to a level so as to increase the reception electric field intensity (RSSi).

The decoding unit 13 further has a function of writing data into, and reading data from, the non-volatile memory 17. On the production line, a control voltage prescribed based on an adjustment signal reception by the receiver is written into the non-volatile memory 17. When the reception electric field intensity (RSSi) or the error rate has a very poor value in excess of a preset value, the decoding unit 13 outputs a control voltage based on a setting of the control voltage stored in the non-volatile memory 17.

In operation, the local oscillator 14 produces a local oscillator frequency based on a reference frequency generated by the reference oscillator 15, and the reception unit 12 demodulates a received signal according to the local oscillator frequency. The received signal which has been demodulated by the reception unit 12 is decoded by the decoding unit 13.

The local oscillator frequency and the reference frequency are related to each other according to the equation: the local oscillator frequency=the reference frequency N/M (where N and M are 1, 2, 3, . . .). Therefore, the local oscillator frequency is adjusted when the reference frequency is modified.

If the local oscillator frequency experiences a large deviation, a then reception electric field intensity of sufficient magnitude is not obtained, and the received signal has a large error rate.

Such a condition is detected by the decoding unit 13, which applies a control voltage, prescribed in a manner so as to eliminate the deviation of the local oscillator frequency, to the variable capacitor 16. As a result, the reference frequency generated by the reference oscillator 15 is varied, automatically adjusting the local oscillator frequency from the local oscillator 14. The reception unit 12 thus demodulates the received signal with a reception electric field intensity of sufficient magnitude at a reduced error rate.

When any deviation of the local oscillator frequency is eliminated, the reception electric field intensity is at a maximum, and the error rate is at a minimum. In this condition, the control voltage remains constant.

In this embodiment, the decoding unit 13 outputs the control voltage whose level varies stepwise to detect a point where the reception electric field intensity is at a maximum and the error rate is at a minimum. For example, if the control voltage is adjustable in a range from 0 V to 3 V, then the decoding unit 13 varies the control voltage in steps of 12 mV until an optimum point is achieved, and produces and outputs a control voltage at this point to cause the reception unit 12 to demodulate the received signal with the local oscillator frequency adjusted based on the outputted control voltage.

When the receiver is manufactured, an adjustment signal is applied to the receiver on the production line, and a control voltage produced by the decoding unit 13 based on the received adjustment signal is stored as a setting in the non-volatile memory 17. Then, when the reception electric field intensity or the error rate has a very poor value in excess of a preset value, the decoding unit 13 outputs a control voltage based, on the setting of the control voltage stored in the non-volatile memory 17, to the variable capacitor 16.

As a consequence, the local oscillator frequency is prevented from being incorrectly adjusted due to noise or the like, but is adjusted so as to keep the receiver in a condition capable of receiving signals with high reception electric field intensity. The setting of the control voltage is stored in the non-volatile memory 17 using a quick and easy process of having the receiver receive the adjustment signal, rather than requiring a manual adjustment process which has conventionally been conducted.

The adjustment signal may comprise a PN (pseudo-noise) random pattern suitable for detecting an error rate, or a pseudo-call pattern capable of detecting an error rate and a reception electric field intensity. For quick production, however, it is preferable to employ a PN (pseudo-noise) random pattern.

In the above embodiment, the local oscillator frequency is automatically adjusted based on both the reception electric field intensity (RSSi) and the error rate. However, the local oscillator frequency may be automatically adjusted based on either the reception electric field intensity (RSSi) or the error rate to produce a local oscillator frequency for allowing the receiver to receive signals with a good condition.

Although certain preferred embodiments of the present invention have been shown and described in detail, it should be understood that various changes and modifications may be made therein without departing from the scope of the appended claims.

What is claimed is:

1. A receiver comprising:

a reception unit for demodulating a received signal;

a decoding unit for decoding the received signal which has been demodulated by said reception unit;

a local oscillator for supplying said reception unit with a local oscillator frequency which is used for demodulating the received signal;

a voltage-controlled oscillator for generating a reference frequency which is used for producing the local oscillator frequency; and a memory for storing a control voltage setting which is obtained based on an adjustment signal received by said receiver when said receiver is manufactured;

wherein, said decoding unit comprises means for monitoring a reception electric field intensity of said reception unit, for controlling a control voltage applied to said voltage-controlled oscillator in a manner so as to increase the reception electric field intensity, and for controlling the control voltage based on the control voltage setting stored in said memory.

2. A receiver according to claim 1, wherein said decoding unit controls the control voltage based on the control voltage setting stored in said memory when the reception electric field intensity is inconsistent with a preset value.

3. A receiver according to claim 2, wherein said memory comprises a semiconductor read/write memory which is capable of storing information without power.

4. A receiver according to claim 2, wherein said decoding unit adjustably controls the control voltage in a stepwise manner and detects a point where the reception electric field intensity is at a maximum, and maintains the control voltage at a value at which the reception electric field intensity is detected to be at a maximum.

5. A receiver according to claim 2, wherein the adjustment signal comprises a PN (pseudo-noise) random pattern signal or a pseudo-call pattern signal.

6. A receiver according to claim 2, wherein said receiver is used in a pager.

7. A receiver according to claim 2, wherein said receiver is used in a portable telephone.

8. A receiver according to claim 1, wherein said memory comprises a semiconductor read/write memory which is capable of storing information without power.

9. A receiver according to claim 1, wherein said decoding unit adjustably controls the control voltage in a stepwise manner, detects a point where the reception electric field intensity is at a maximum, and maintains the control voltage at a value at which the reception electric field intensity is detected to be at a maximum.

10. A receiver according to claim 1, wherein the adjustment signal comprises a PN (pseudo-noise) random pattern signal or a pseudo-call pattern signal.

11. A receiver comprising:

a reception unit for demodulating a received signal;

a decoding unit for decoding the received signal which has been demodulated by said reception unit;

a local oscillator for supplying said reception unit with a local oscillator frequency which is used for demodulating the received signal;

a voltage-controlled oscillator for generating a reference frequency which is used for producing the local oscillator frequency; and a memory for storing a control voltage setting which is obtained based on an adjustment signal received by said receiver when said receiver is manufactured;

wherein, said decoding unit comprises means for monitoring an error rate of the received signal which has been demodulated by said reception unit, for controlling a control voltage applied to said voltage-controlled oscillator in a manner so as to reduce the error rate, and for controlling the control voltage based on the control voltage setting stored in said memory.

12. A receiver according to claim 11, wherein said decoding unit controls the control voltage based on the control voltage setting stored in said memory when the error rate is inconsistent with a preset value.

13. A receiver according to claim 12, wherein said memory comprises a semiconductor read/write memory which is capable of storing information without power.

14. A receiver according to claim 12, wherein said decoding unit adjustably controls the control voltage in a stepwise manner, detects a point where the error rate is at a minimum, and maintains the control voltage at a value at which the error rate is detected to be at a minimum.

15. A receiver according to claim 12, wherein the adjustment signal comprises a PN (pseudo-noise) random pattern signal or a pseudo-call pattern signal.

16. A receiver according to claim 12, wherein said receiver is used in a pager.

17. A receiver according to claim 12, wherein said receiver is used in a portable telephone.

18. A receiver according to claim 11, wherein the memory comprises a semiconductor read/write memory which is capable of storing information without power.

19. A receiver according to claim 11, wherein said decoding unit adjustably controls the control voltage in a stepwise manner, detects a point where the error rate is at a minimum, and maintains the control voltage at a value at which the error rate is detected to be at a minimum.

20. A receiver according to claim 11, wherein the adjustment signal comprises a PN (pseudo-noise) random pattern signal or a pseudo-call pattern signal.

* * * * *